US012757450B2

(12) United States Patent
Chang et al.

(10) Patent No.: US 12,757,450 B2
(45) Date of Patent: Oct. 6, 2026

(54) FULLY-ISOLATED MOS DEVICE

(71) Applicant: United Microelectronics Corp., Hsinchu (TW)

(72) Inventors: Yu Hsuan Chang, New Taipei City (TW); Ching-Wei Li, Hsinchu City (TW); Jih San Lee, Hsinchu City (TW); Tien-Hao Tang, Hsinchu City (TW)

(73) Assignee: United Microelectronics Corp., Hsinchu (TW)

( * ) Notice: Subject to any disclaimer, the term of this patent is extended or adjusted under 35 U.S.C. 154(b) by 384 days.

(21) Appl. No.: 18/404,895

(22) Filed: Jan. 5, 2024

(65) Prior Publication Data

US 2025/0203957 A1 Jun. 19, 2025

(30) Foreign Application Priority Data

Dec. 14, 2023 (TW) ................................ 112148836

(51) Int. Cl.
*H10D 62/10* (2025.01)
*H10D 62/13* (2025.01)

(52) U.S. Cl.
CPC ......... *H10D 62/102* (2025.01); *H10D 62/116* (2025.01); *H10D 62/126* (2025.01); *H10D 62/151* (2025.01)

(58) Field of Classification Search
CPC .. H10D 62/102; H10D 62/116; H10D 62/126; H10D 62/151; H10D 62/127; H10D 62/106
See application file for complete search history.

(56) References Cited

U.S. PATENT DOCUMENTS 8,530,969 B2 9/2013 Chen et al.
9,627,210 B2 4/2017 Wang et al.
9,691,752 B1 * 6/2017 Chao .................... H10D 62/116
2003/0001199 A1 * 1/2003 Shibib .................. H10D 89/611 257/330
2012/0199878 A1 * 8/2012 Shrivastava ......... H10D 62/116 438/286

(Continued)

OTHER PUBLICATIONS

A Review on the ESD Robustness of Drain-Extended MOS Devices, Shrisvastava et al., IEEE Trans. Devices Materials, vol. 12, No. 4, pp. 615-625, Dec. 2012. (Year: 2012).*

(Continued)

*Primary Examiner* — S M Sohel Imtiaz
(74) *Attorney, Agent, or Firm* — JCIPRNET

(57) ABSTRACT

A fully-isolated metal oxide semiconductor (MOS) device includes a substrate, an isolation well, a gate structure, a source region, a gradient region, a drain region, a first well, and an electro static discharge (ESD) protection region. The isolation well is formed in the substrate, and the gate structure is formed on the isolation well. The source region and the gradient region are formed in the isolation wells on both sides of the gate structure respectively, and the drain region is formed in the gradient region. The first well is formed below the drain region in the gradient region, and the ESD protection region is formed in the first well. The isolation well and the ESD protection region have a first conductivity type, and the gradient region and the first well have a second conductivity type.

12 Claims, 10 Drawing Sheets

(56) References Cited

U.S. PATENT DOCUMENTS

| | | | | |
|---|---|---|---|---|
| 2013/0187232 | A1* | 7/2013 | Takasu | H10D 30/603 257/360 |
| 2013/0207184 | A1* | 8/2013 | Chen | H10D 30/603 257/E29.256 |
| 2014/0070315 | A1* | 3/2014 | Levy | H10D 30/0281 438/286 |
| 2015/0255595 | A1* | 9/2015 | Hebert | H10D 30/65 438/286 |
| 2016/0268137 | A1* | 9/2016 | Wang | H10D 89/815 |
| 2018/0114787 | A1* | 4/2018 | Lin | H10D 89/713 |
| 2022/0310589 | A1* | 9/2022 | Peng | H10D 89/601 |
| 2022/0376039 | A1* | 11/2022 | Braun | H10D 30/0221 |
| 2023/0081508 | A1* | 3/2023 | Tu | H10D 30/0221 257/288 |

OTHER PUBLICATIONS

A Method to Prevent Strong Snapback in LDNMOS for ESD Protection, Hang Fan et al., IEEE Trans. Devices Materials, vol. 13, np. 1, pp. 50-53, Mar. 2013. (Year: 2013).*

* cited by examiner

FULLY-ISOLATED MOS DEVICE

CROSS-REFERENCE TO RELATED APPLICATION

This application claims the priority benefit of Taiwan application serial no. 112148836, filed on Dec. 14, 2023. The entirety of the above-mentioned patent application is hereby incorporated by reference herein and made a part of this specification.

BACKGROUND

Technical Field

This disclosure relates to a MOS device (metal oxide semiconductor device), in particular to a fully-isolated MOS device.

Description of Related Art

Among power devices with high-voltage processing capabilities, a laterally diffused metal oxide semiconductor (LDMOS) or an extended drain metal oxide semiconductor (EDMOS) are widely used in high-voltage operating environments due to their high operating bandwidth and efficiency, as well as their structures that can be integrated with other integrated circuits.

In order to operate at negative voltages, in a bipolar-complementary metal oxide semiconductor-double diffused metal oxide semiconductor (Bipolar-CMOS-DMOS, BCD) process, there is already a design where a P-type well is disposed in the NMOS device to completely enclose the source, the drain, and the channel, and this type of MOS device is also referred to as a fully-isolated (FISO) MOS device.

However, the devices have been found to have insufficient electro static discharge (ESD) robustness.

SUMMARY

The disclosure provides a fully-isolated metal oxide semiconductor (MOS) device, capable of improving electro static discharge (ESD) performance and maintain a high breakdown voltage.

The fully-isolated MOS device of the disclosure includes a substrate, an isolation well, a gate structure, a source region, a gradient region, a drain region, a first well, and an ESD protection region. The isolation well and the ESD protection region have a first conductivity type, and the gradient region and the first well have a second conductivity type. The isolation well is formed in the substrate, and the gate structure is formed on the isolation well. The source region and the gradient region are formed in the isolation wells on both sides of the gate structure respectively, and the drain region is formed in the gradient region. The first well is formed below the drain region in the gradient region, and the ESD protection region is formed in the first well.

In an embodiment of the disclosure, the first well extends downward to the isolation well.

In an embodiment of the disclosure, the ESD protection region is in direct contact with the drain region.

In an embodiment of the disclosure, the ESD protection region is far away from the drain region.

In an embodiment of the disclosure, a doping concentration of the ESD protection region is greater than a doping concentration of the isolation well.

Another fully-isolated MOS device of the disclosure includes a substrate, an isolation well, a gate structure, a source region, a gradient region, and a drain region. The isolation well and the ESD protection region have a first conductivity type, and the gradient region and the first well have a second conductivity type. The isolation well is formed in the substrate, and the gate structure is formed on the isolation well. The source region and the gradient region are formed in the isolation wells on both sides of the gate structure respectively, and the drain region is formed in the gradient region and is spaced from the gate structure by a predetermined distance. The drain region includes a first heavily doped region and a second heavily doped region, and the second heavily doped region surrounds the first heavily doped region in a plan view. The isolation well and the first heavily doped region have the first conductivity type, and the gradient region and the second heavily doped region have the second conductivity type.

In another embodiment of the disclosure, the fully-isolated MOS device may further include a first well formed below the first heavily doped region and extending downward to the isolation well.

In another embodiment of the disclosure, a ratio of an area of the first heavily doped region to an area of the second heavily doped region is 1:1 to 3:1.

In various embodiments of the disclosure, the fully-isolated MOS device may further include multiple protection ring surrounding the isolation well.

In various embodiments of the disclosure, the fully-isolated MOS device may further include a first isolation structure formed between the protection ring and the source region.

In various embodiments of the disclosure, the protection ring includes a third heavily doped region and a fourth heavily doped region. The third heavily doped region surrounds the isolation well, and the third heavily doped region has the second conductivity type. The fourth heavily doped region surrounds the third heavily doped region, and the fourth heavily doped region has the first conductivity type.

In various embodiments of the disclosure, the fully-isolated MOS device may further include a first body region adjacent to the source region, and the first body region has the first conductivity type.

In various embodiments of the disclosure, the fully-isolated MOS device may further include a second body region formed in the isolation well on a first side of the gate structure to surround the source region. The second body region has the first conductivity type.

In various embodiments of the disclosure, the fully-isolated MOS device may further include a fourth well formed in the isolation well on the first side of the gate structure to surround the second body region. The fourth well has the first conductivity type.

In various embodiments of the disclosure, the fully-isolated MOS device may further include a second isolation structure formed between the gate structure and the drain region.

Based on the above, the disclosure increases effectiveness of ESD protection by altering the design of a drain of an element to form an ESD protection region below the drain or by inserting doped regions of different conductivity types into the drain. In addition, well regions of different conductivity types may be added below the drain of the element to maintain a high breakdown voltage.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
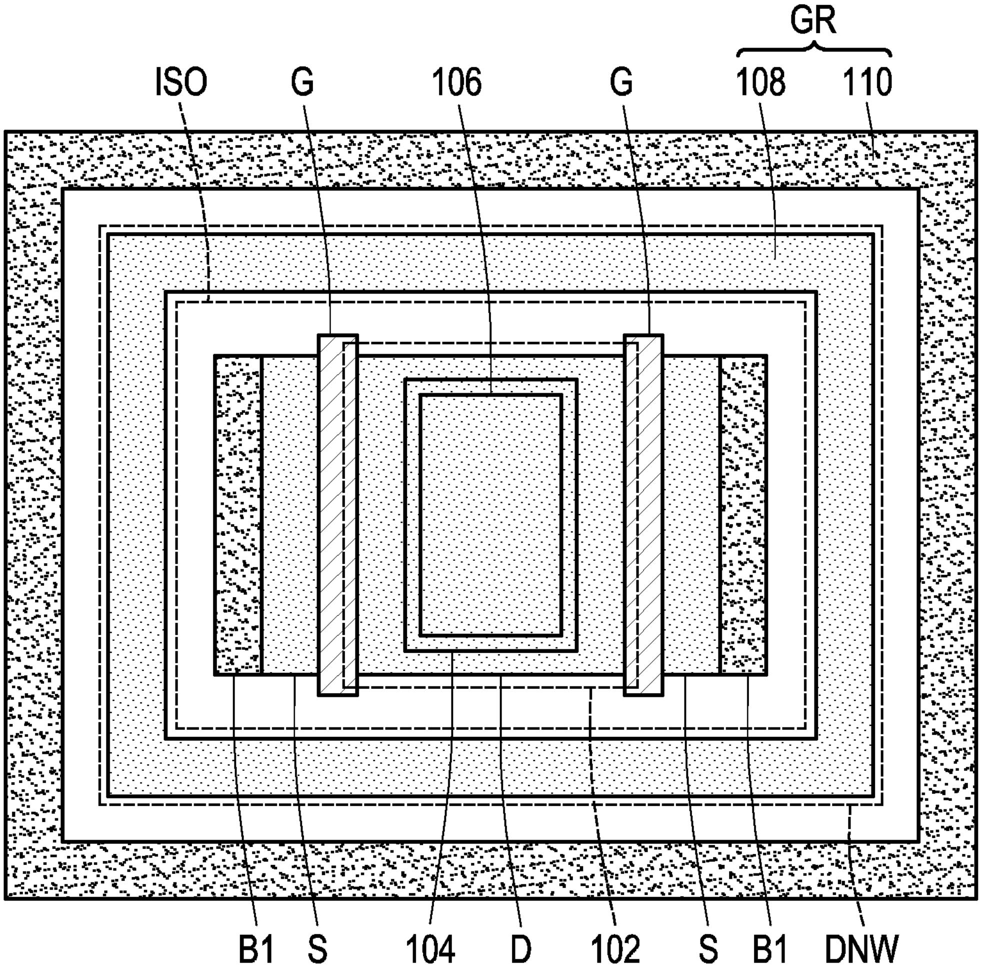
FIG. 1 is a plan view of a layout of a fully-isolated MOS device according to a first embodiment of the disclosure.
Figure 2A:
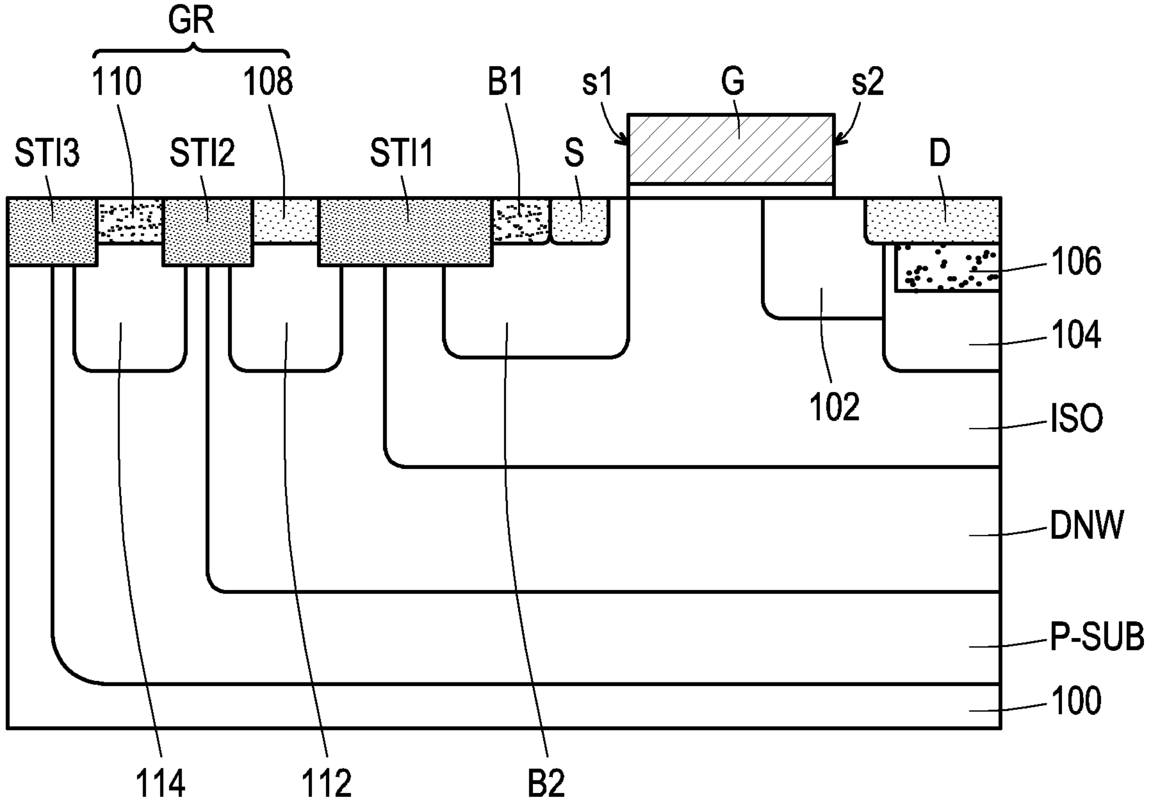
FIG. 2A is a schematic cross-sectional view of an example of the fully-isolated MOS device according to the first embodiment.

FIG. 1 is a plan view of a layout of a fully-isolated MOS device according to a first embodiment of the disclosure. FIG. 2A is a schematic cross-sectional view of an example of the fully-isolated MOS device according to the first embodiment and shows only one gate structure G, so FIG. 2A may be considered a cross-sectional view of half the structure of FIG. 1.

Please refer to FIG. 1 first. The fully-isolated MOS device includes a substrate, an isolation well ISO, a gate structure G, a source region S, a gradient region 102, a drain region D, a first well 104, and an ESD protection region 106, and an extended drain MOS (EDMOS) device is taken as an example in the first embodiment. The source region S and the gradient region 102 are formed in the isolation wells ISO on both sides of the gate structure G respectively, and the drain region D is formed in the gradient region 102. Thus, if there are two gate structures G in FIG. 1, the gradient region 102 and the drain region D may be located between two gate structures G, and the source region S is located outside the two gate structures G. Since the isolation well ISO surrounds the source region S and the drain region D, an effect of isolating the source region S and the drain region D from the surrounding elements is achieved.

The isolation well ISO and the ESD protection region 106 have a first conductivity type, the gradient region 102 and the first well 104 have a second conductivity type, and the source region S and the drain region D also have the second conductivity type. In an embodiment, the first conductivity type is P-type and the second conductivity type is N-type. In another embodiment, the first conductivity type is N-type and the second conductivity type is P-type.

Please refer to FIG. 1 and FIG. 2A at the same time. The isolation well ISO is formed in the substrate 100, and the gate structure G is formed on the isolation well ISO. The first well 104 is formed below the drain region D in the gradient region 102, and the ESD protection region 106 is formed in the first well 104. In this embodiment, the first well 104 extends downward to the isolation well ISO, and the ESD protection region 106 is in direct contact with the drain region D. If the source region S and the drain region D are N-type heavily doped regions, then the P-type ESD protection region 106 may obtain good ESD performance, and the N-type first well 104 is favorable for maintaining a high breakdown voltage of the element itself. In an embodiment, a doping concentration of the ESD protection region 106 is greater than a doping concentration of the isolation well ISO.

Please continue to refer to FIG. 2A. The fully-isolated MOS device of the first embodiment may also include a protection ring GR surrounding the isolation well ISO, and a first isolation structure STI1 may also be included between the protection ring GR and the source region S. It should be understood that although the terms "first", "second", etc. are used in this disclosure to describe different devices or regions, these devices or regions are not limited to these terms, but rather, these terms are used to distinguish one device or region from another device or region.

The protection ring GR includes a third heavily doped region 108 and a fourth heavily doped region 110. The third heavily doped region 108 surrounds the isolation well ISO, and the third heavily doped region 108 has the second conductivity type. The fourth heavily doped region 110 surrounds the third heavily doped region 108, and the fourth heavily doped region 110 has the first conductivity type. In one embodiment, a second isolation structure STI2 is disposed between the third heavily doped region 108 and the fourth heavily doped region 110, and a third isolation structure STI3 is disposed outside the fourth heavily doped region 110. In addition, a second well 112 is between the first isolation structure STI1 and the second isolation structure STI2, and a third well 114 is between the second isolation structure STI2 and the third isolation structure STI3. The second well 112 surrounds the third heavily doped region 108 and has the same conductivity type as the third heavily doped region 108. In one embodiment, the first well 104 and the second well 112 may be formed together, so they may have the same doping concentration and depth, but the disclosure is not limited thereto. Moreover, the first well 104 and the second well 112 are at the same potential, so there will be no punch through problem during operation, and because a path from the source region S of a single device to the source region S of a next device is very long, it is also less prone to a latch-up effect. The third well 114 surrounds the fourth heavily doped region 110 and has the same conductivity type as the fourth heavily doped region 110. If the second well 112 is N-type, a deep N-type well DNW may be formed in the substrate 100 to surround the second well 112, and a P-type region P-SUB may be formed outside the deep N-type well DNW and connected to the third well 114.

Please continue to refer to FIG. 1 and FIG. 2A. The fully-isolated MOS device of the first embodiment may also include a first body region B1 adjacent to the source region S, so the first body region B1 will also be adjacent to the first isolation structure STI1, where the first body region B1 has the first conductivity type. In one embodiment, the doping concentration of the ESD protection region 106 is smaller than a doping concentration of the first body region B1. In addition, a second body region B2 may also be formed in the isolation well ISO on a first side s1 of the gate structure G to surround the source region S, where the second body region B2 has the first conductivity type.

As for the gradient region 102, it is formed in the isolation well ISO on a second side s2 of the gate structure G, and may partially overlap with the gate structure G in the vertical direction. Therefore, an area of the gradient region 102 is slightly larger than the drain region D. The gradient region 102 refers to a region where the doping concentration is distributed in a gradient. The closer to the drain region D, the higher the concentration. In addition, the layout diagram (FIG. 1) shows that the source region S and the drain region D are adjacent to the gate structure G. However, in fact, in the cross-sectional structure of the EDMOS device (FIG. 2A), the source region S and the drain region D may not be in direct contact with the gate structure.

Figure 2B:
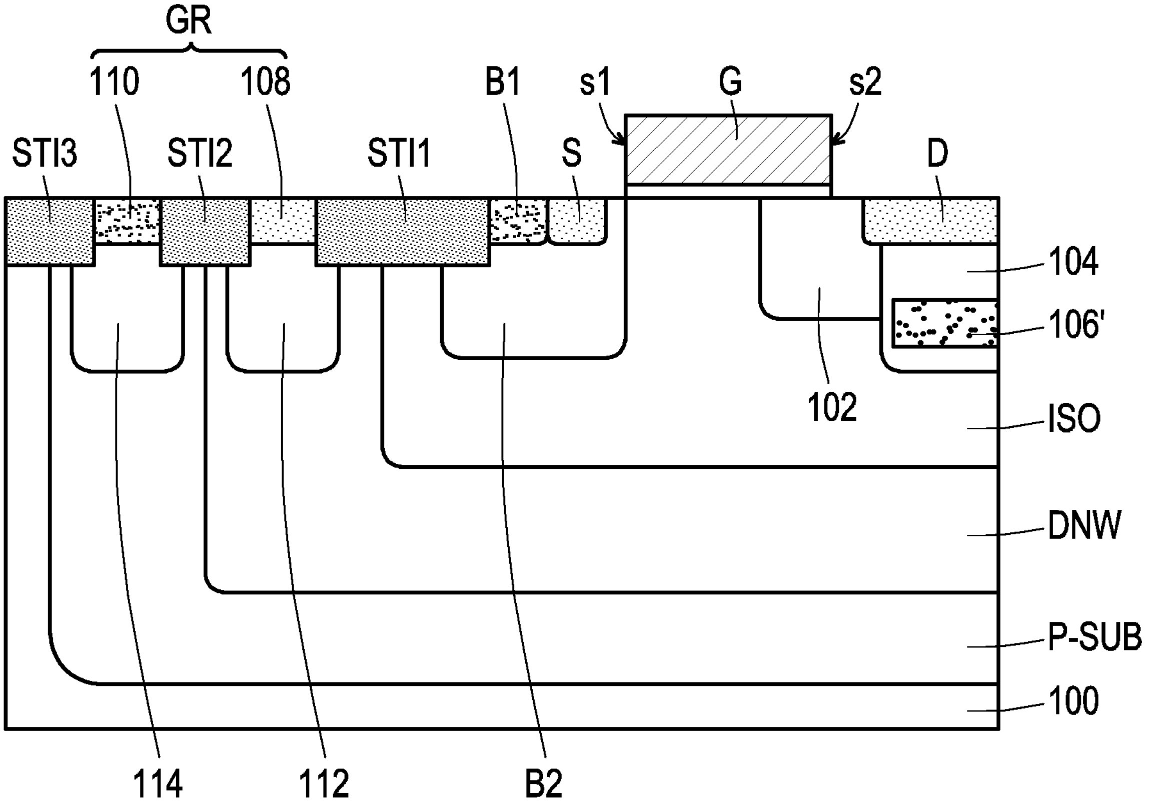
FIG. 2B is a schematic cross-sectional view of another example of the fully-isolated MOS device according to the first embodiment.

FIG. 2B is a schematic cross-sectional view of another example of the fully-isolated MOS device according to the first embodiment, and shows only one gate structure G, so FIG. 2B may be considered a cross-sectional view of half the structure of FIG. 1.

In FIG. 2B, an ESD protection region 106' is far away from the drain region D. That is, the ESD protection region 106' formed in the first well 104 is still located below the drain region D but not in contact with the drain region D. Moreover, the ESD protection region 106' in the figure is disposed in the region below the bottom of the gradient region 102, but the disclosure is not limited thereto. The ESD protection region 106' may also be disposed in the first well 104 within the gradient region 102 but not in contact with the drain region D.

Figure 3:
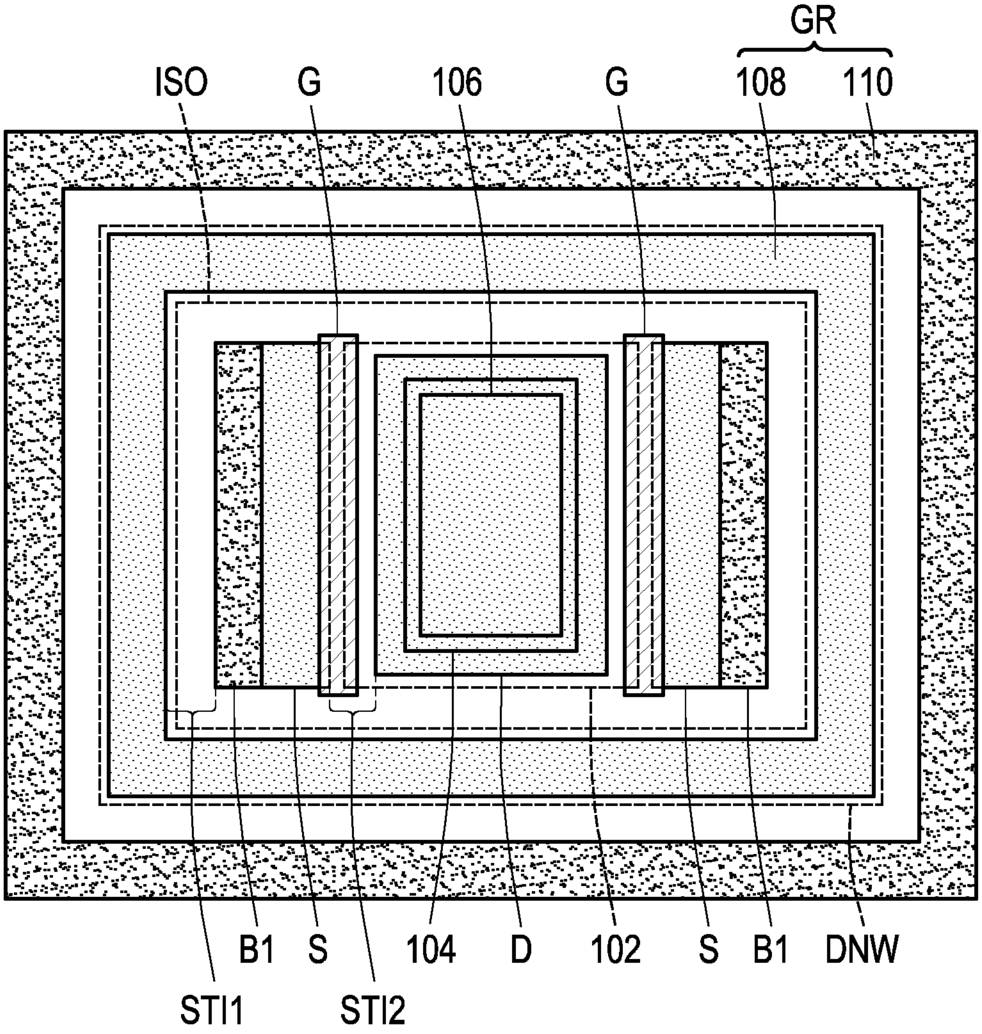
FIG. 3 is a plan view of a layout of a fully-isolated MOS device according to a second embodiment of the disclosure.
Figure 4A:
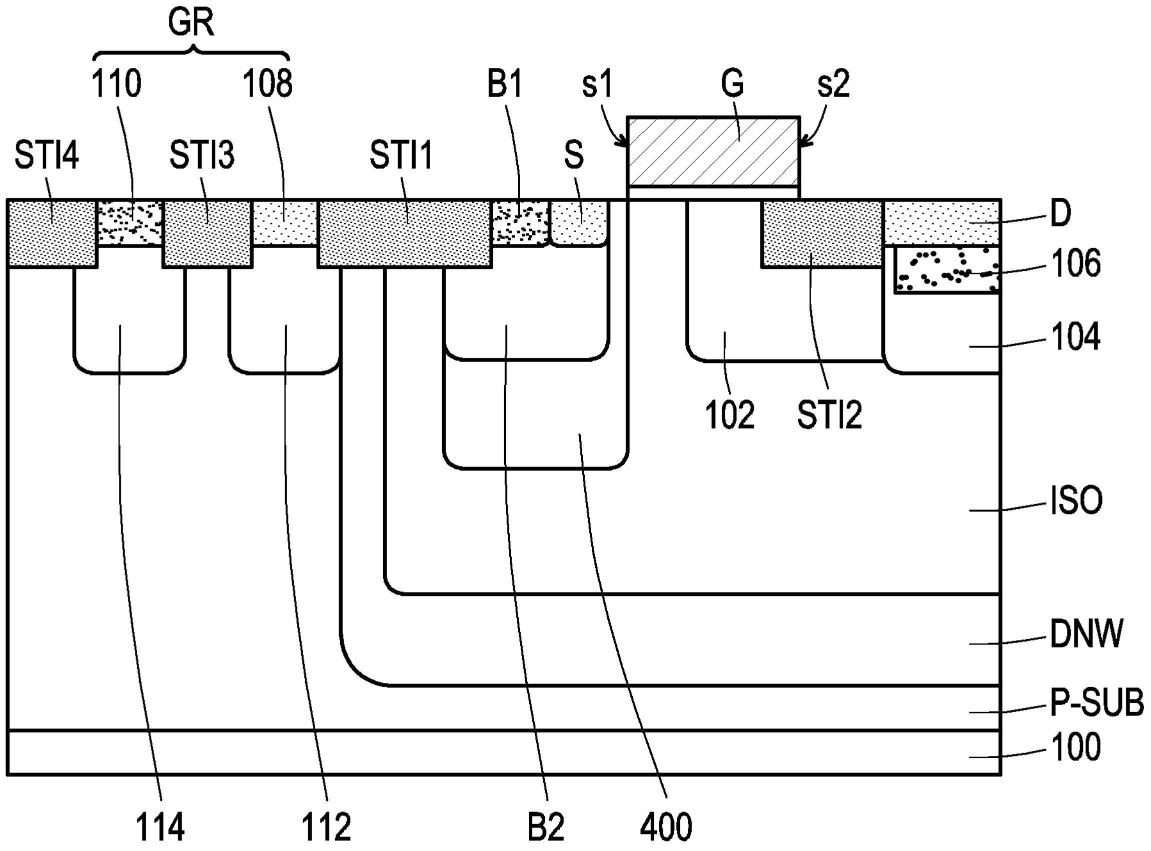
FIG. 4A is a schematic cross-sectional view of an example of the fully-isolated MOS device according to the second embodiment.

FIG. 3 is a plan view of a layout of a fully-isolated MOS device according to a second embodiment of the disclosure, where the same numeral references as those in the first embodiment are used to represent the same or similar parts and components, and the relevant content of the same or similar parts and components may also be referred to the contents of the first embodiment, which will not be repeated in the following. FIG. 4A is a schematic cross-sectional view of an example of the fully-isolated MOS device according to the second embodiment, and shows only one gate structure G, so FIG. 4A may be considered a cross-sectional view of half the structure of FIG. 3.

Please refer to FIG. 3 and FIG. 4A at the same time. A laterally diffused metal oxide semiconductor (LDMOS) device is taken as an example in the second embodiment, and therefore differs from the structure of the first embodiment in that, for example, a second isolation structure STI2 is further disposed between the gate structure G and the drain region D, which separates the gate structure G from the drain region D. In addition, a fourth well 400 is further disposed in the isolation well ISO on the first side s1 of the gate structure G to surround the second body region B2, where the fourth well 400 has the first conductivity type. The deep N-type well DNW of FIG. 4A surrounds the isolation well ISO, and the second well 112 and the third well 114 are formed in the P-type region P-SUB.

Figure 4B:
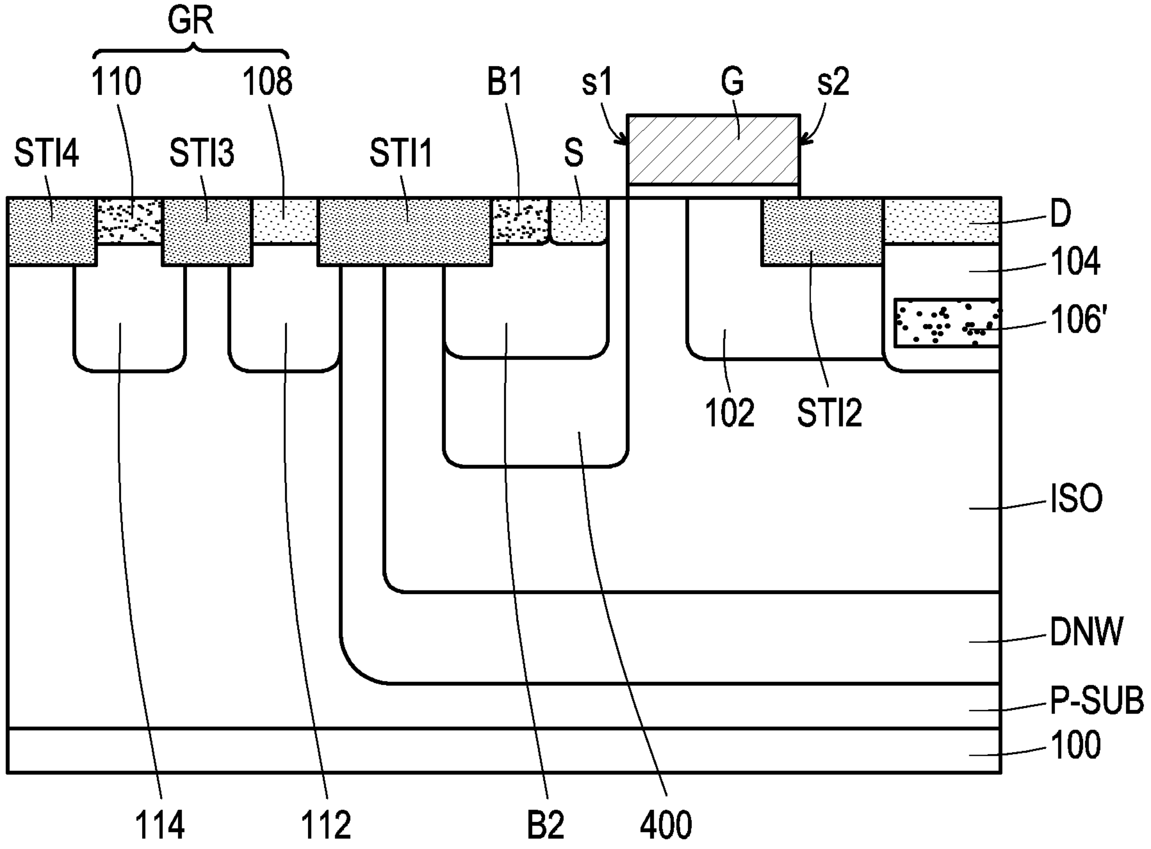
FIG. 4B is a schematic cross-sectional view of another example of the fully-isolated MOS device according to the second embodiment.

FIG. 4B is a schematic cross-sectional view of another example of the fully-isolated MOS device according to the second embodiment, and shows only one gate structure G, so FIG. 4B may be considered a cross-sectional view of half the structure of FIG. 3.

In FIG. 4B, the ESD protection region 106' is far away from the drain region D. That is, the ESD protection region 106' formed in the first well 104 is still located below the drain region D but not in contact with the drain region D.

Figure 5:
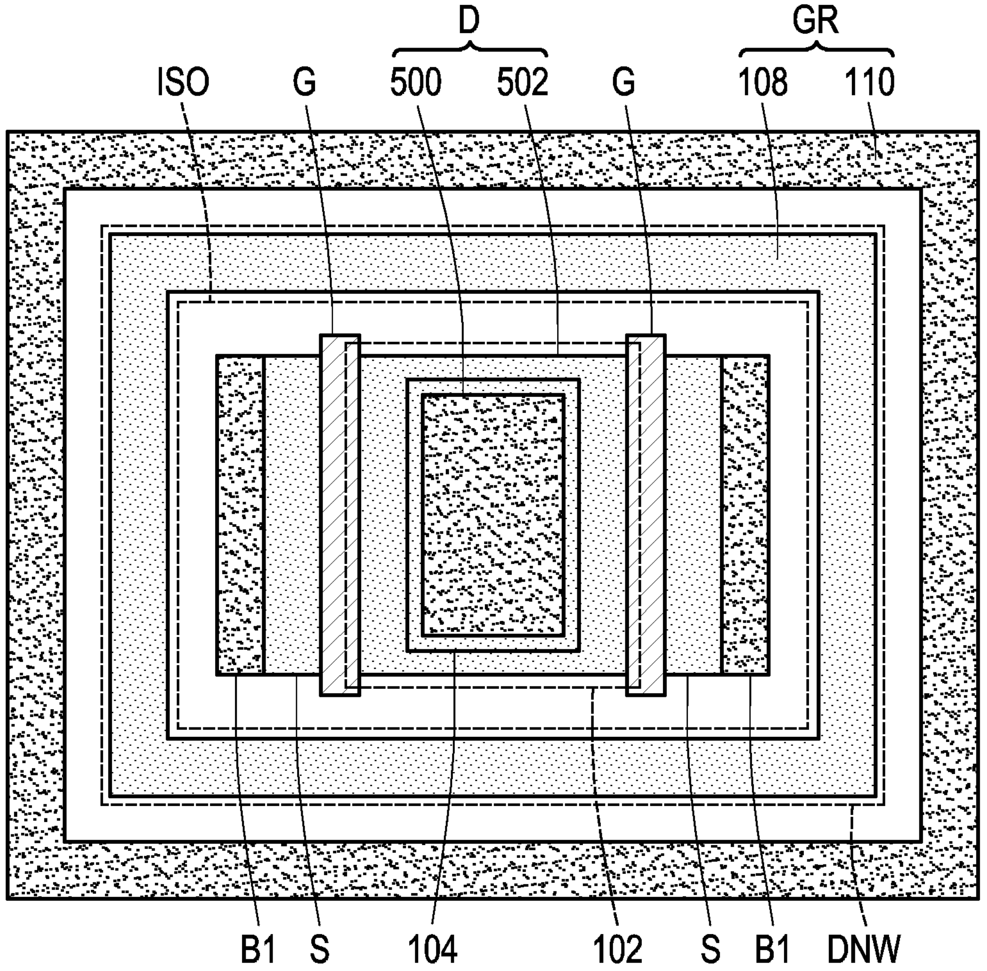
FIG. 5 is a plan view of a layout of a fully-isolated MOS device according to a third embodiment of the disclosure.
Figure 6:
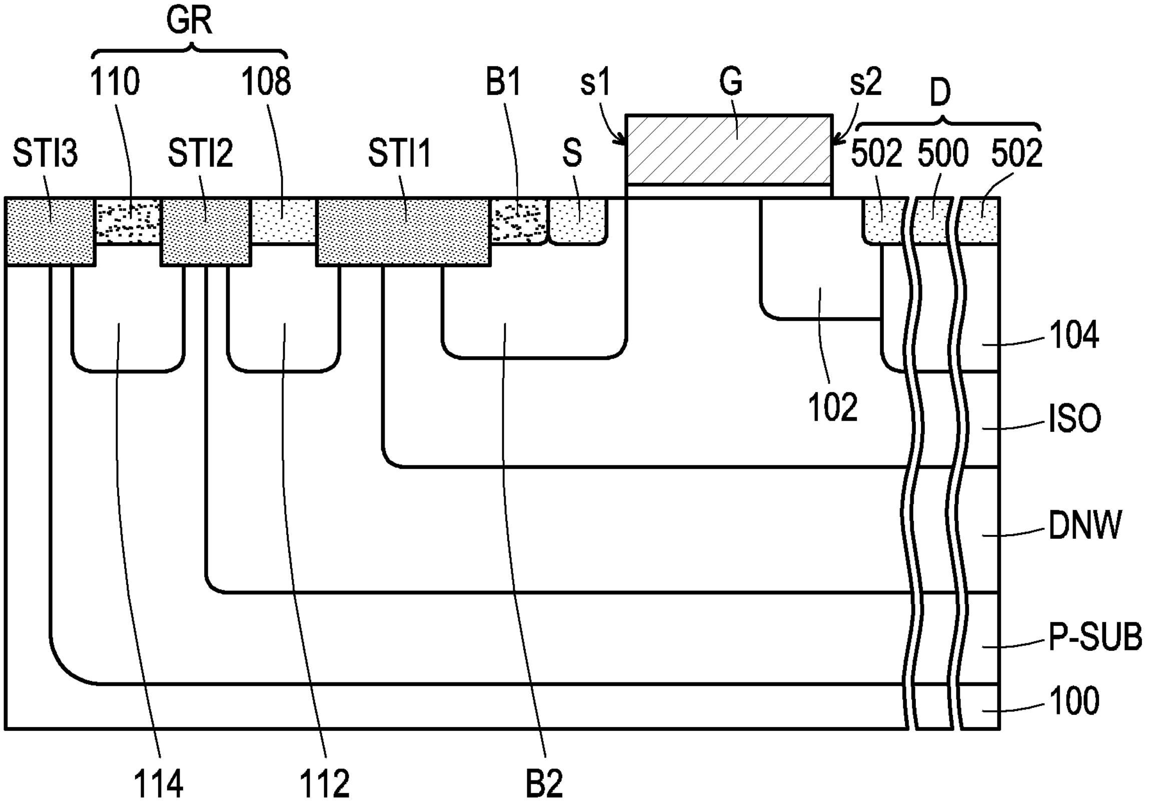
FIG. 6 is a schematic cross-sectional view of an example of the fully-isolated MOS device according to the third embodiment.

FIG. 5 is a plan view of a layout of a fully-isolated MOS device according to a third embodiment of the disclosure, where the same numeral references as those in the first embodiment are used to represent the same or similar parts and components, and the relevant content of the same or similar parts and components may also be referred to the contents of the first embodiment, which will not be repeated in the following. FIG. 6 is a schematic cross-sectional view of an example of the fully-isolated MOS device according to the third embodiment.

Please refer to FIG. 5 and FIG. 6 at the same time. An extended drain MOS (EDMOS) device is taken as an example in the third embodiment, and the fully-isolated MOS device of the third embodiment includes the substrate 100, the isolation well ISO, the gate structure G, the source region S, the gradient region 102, and the drain region D. The difference between this embodiment and the first embodiment is that the drain region D includes a first heavily doped region 500 and a second heavily doped region 502, and the second heavily doped region 502 surrounds the first heavily doped region 500 in a plan view, where the first heavily doped region 500 and the isolation well ISO are both of the first conductivity type, the second heavily doped region 502 and the gradient region 102 are both of the second conductivity type, and a contact of the drain region D connecting to the outside may be disposed in the first heavily doped region 500. In one embodiment, a ratio of an area of the first heavily doped region 500 to an area of the second heavily doped region 502 is, for example, 1:1 to 3:1, within which it is helpful to improve the ESD performance and to maintain the operation of the device. In addition, the first well 104 formed below the first heavily doped region 500 may also extend downward to the isolation well ISO, and is favorable for maintaining a high breakdown voltage.

Figure 7:
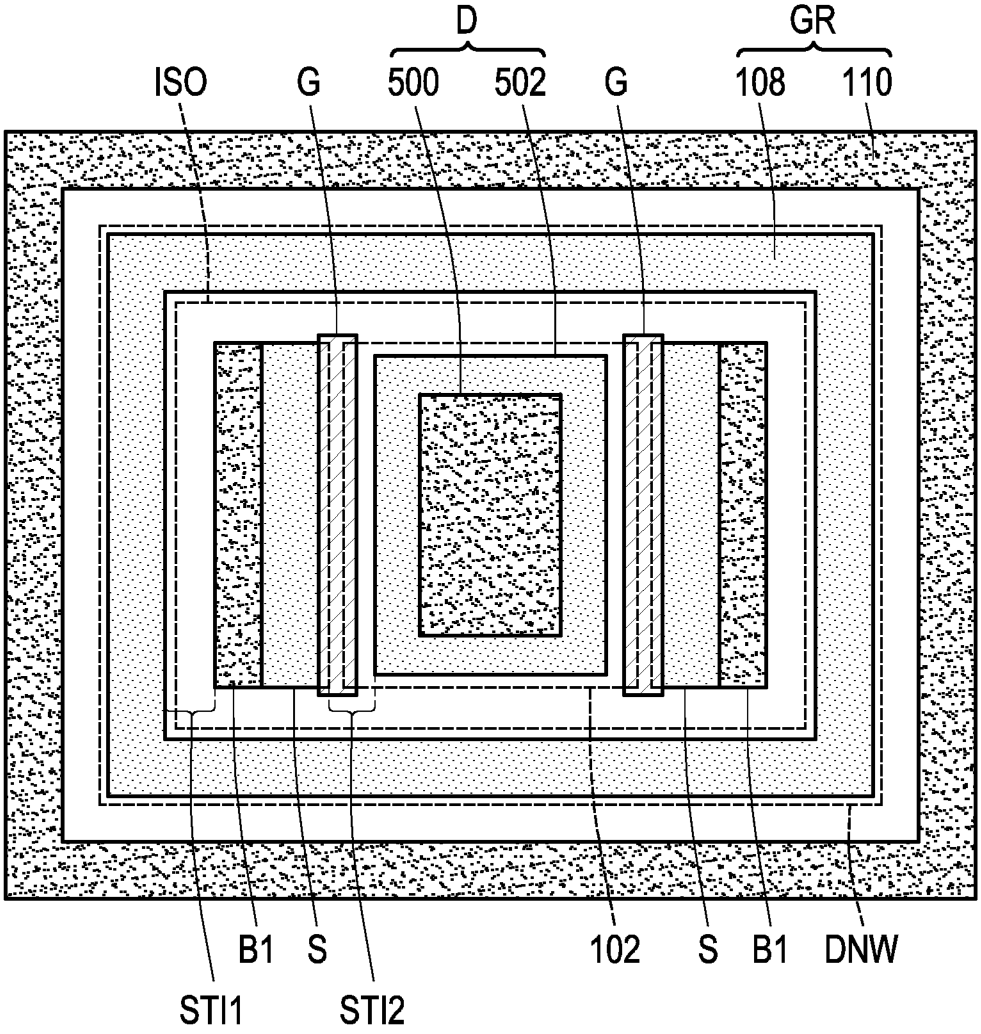
FIG. 7 is a plan view of a layout of a fully-isolated MOS device according to a fourth embodiment of the disclosure.
Figure 8:
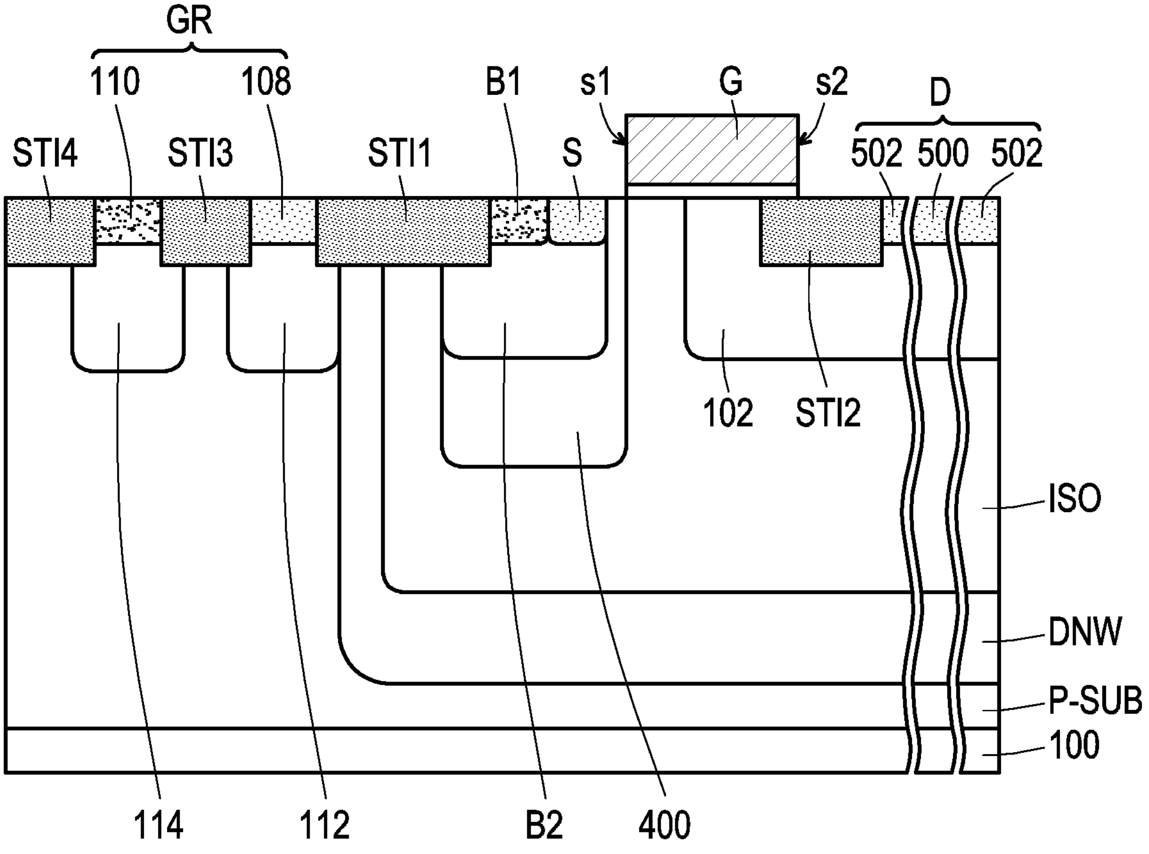
FIG. 8 is a schematic cross-sectional view of an example of the fully-isolated MOS device according to the fourth embodiment.

FIG. 7 is a plan view of a layout of a fully-isolated MOS device according to a fourth embodiment of the disclosure, where the same numeral references as those in the second embodiment are used to represent the same or similar parts and components, and the relevant content of the same or similar parts and components may also be referred to the contents of the second embodiment, which will not be repeated in the following. FIG. 8 is a schematic cross-sectional view of an example of the fully-isolated MOS device according to the fourth embodiment.

Please refer to FIG. 7 and FIG. 8 at the same time. A laterally diffused metal oxide semiconductor (LDMOS) device is taken as an example in the fourth embodiment. The difference between the fully-isolated MOS device of the fourth embodiment and the second embodiment is that the drain region D includes a first heavily doped region 500 and a second heavily doped region 502, and the second heavily doped region 502 surrounds the first heavily doped region 500 in a plan view, where the first heavily doped region 500 and the isolation well ISO are both of the first conductivity type, the second heavily doped region 502 and the gradient region 102 are both of the second conductivity type, and a contact of the drain region D connecting to the outside may be disposed in the first heavily doped region 500. In one embodiment, a ratio of an area of the first heavily doped region 500 to an area of the second heavily doped region 502 is, for example, 1:1 to 3:1, within which it is helpful to improve the ESD performance and to maintain the operation of the device. In addition, in contrast to the structure on a side of a drain D of FIG. 4B, the fourth embodiment does not have a first well (104 in FIG. 4B) below the first heavily doped region 500. This is because the gradient region 102 in the fourth embodiment frames the first heavily doped region 500, so there is no need for an additional first well to frame the ESD protection region (e.g., 106' of FIG. 4B) away from the drain D, as is needed in FIG. 4B. However, the disclosure is not limited thereto. In another embodiment, if the depth of the gradient region 102 is shallower than the first heavily doped region 500, an additional first well is needed to frame the first heavily doped region 500.

The following experiments are listed to verify the implementation effect of the disclosure, but the disclosure is not limited to the following content.

Experimental Example 1

A 9V N-type extended drain metal oxide semiconductor (EDNMOS) device was fabricated using a 0.18 μm BCD process with the structure shown in FIG. 2A. The control example was the same structure but without the ESD protection region 106. The results are shown in Table 1 below.

TABLE 1

| | DC | ESD | |
|---|---|---|---|
| | BV (V) | HBM (kV) | MM (kV) |
| control example (without an ESD protection region) | 18.2 | 1.6 | 250 |
| with an ESD protection region | 17.9 | 2.8 | 300 |

BV in Table 1 is the breakdown voltage, HBM is a human body model result, and MM is a machine model result.

From Table 1, it can be seen that the HBM of an EDNMOS device with an ESD protection region is improved by 75% (=(2.8−1.6)/1.6*100%).

Experimental Example 2

A 24V N-type laterally diffused metal oxide semiconductor (LDNMOS) device was fabricated using a 0.18 μm BCD process with the structure shown in FIG. 4A. The control example was the same structure but without the ESD protection region 106. The results are shown in Table 2 below.

TABLE 2

| | DC | ESD | |
|---|---|---|---|
| | BV (V) | HBM (kV) | MM (kV) |
| control example (without an ESD protection region) | 48 | 2.2 | 240 |
| with an ESD protection region | 44 | 2.8 | 300 |

From Table 2, it can be seen that the HBM of a LDNMOS device with an ESD protection region is improved by 27%.

Experimental Example 3

A 9V EDNMOS device was fabricated using a 0.18 μm BCD process with the structure shown in FIG. 6. A ratio of the area of the first heavily doped region 500 (P+ region) to an area of the second heavily doped region 502 (N+ region) is 2:1. The control example was the same structure as FIG. 6 but all the drain region D is the second heavily doped region 502 (N+ region). The results are shown in Table 3 below.

TABLE 3

| | DC | ESD | |
|---|---|---|---|
| | BV (V) | HBM (kV) | MM (kV) |
| control example (without a P+ region) | 18.2 | 1.6 | 250 |
| with a P+ region | 16.7 | 8 | 450 |

It can be seen from Table 3 that the HBM of an EDNMOS device with a P+ region on the drain is improved by 400%.

Experimental Example 4

A 24V LDNMOS device was fabricated using a 0.18 μm BCD process with the structure shown in FIG. 8. A ratio of the area of the first heavily doped region 500 (P+ region) to the area of the second heavily doped region 502 (N+ region) is 2:1. The control example was the same structure as FIG. 8 but all the drain region D is the second heavily doped region 502 (N+ region). The results are shown in Table 4 below.

TABLE 4

| | DC | ESD | |
|---|---|---|---|
| | BV (V) | HBM (kV) | MM (kV) |
| control example (without a P+ region) | 48 | 2.2 | 240 |
| with a P+ region | 49.6 | 5.5 | 450 |

It can be seen from Table 4 that the HBM of a LDNMOS device with a P+ region on the drain is improved by 150%, and the breakdown voltage is also improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fully-isolated metal oxide semiconductor (MOS) device, comprising:

a substrate;

an isolation well, formed in the substrate, the isolation well having a first conductivity type;

a gate structure, formed on the isolation well;

a source region, formed in the isolation well on a first side of the gate structure;

a gradient region, formed in the isolation well on a second side of the gate structure, the gradient region having a second conductivity type;

a drain region, formed in the gradient region, and separated from the gate structure by a predetermined distance;

a first well, formed below the drain region in the gradient region, the first well having the second conductivity type; and an electro static discharge (ESD) protection region, formed in the first well, the ESD protection region having the first conductivity type.

2. The fully-isolated MOS device according to claim 1, wherein the first well extends downward to the isolation well.

3. The fully-isolated MOS device according to claim 1, wherein the ESD protection region is in direct contact with the drain region.

4. The fully-isolated MOS device according to claim 1, wherein the ESD protection region is far away from the drain region.

5. The fully-isolated MOS device according to claim 1, wherein a doping concentration of the ESD protection region is greater than a doping concentration of the isolation well.

6. The fully-isolated MOS device according to claim 1 further comprising: a protection ring surrounding the isolation well.

7. The fully-isolated MOS device according to claim 6 further comprising: a first isolation structure formed between the protection ring and the source region.

8. The fully-isolated MOS device according to claim 6, wherein the protection ring comprises:

a third heavily doped region, surrounding the isolation well, the third heavily doped region having the second conductivity type; and a fourth heavily doped region, surrounding the third heavily doped region, the fourth heavily doped region having the first conductivity type.

9. The fully-isolated MOS device according to claim 1 further comprising: a first body region adjacent to the source region, the first body region having the first conductivity type.

10. The fully-isolated MOS device according to claim 1 further comprising: a second body region formed in the isolation well on the first side of the gate structure to surround the source region, wherein the second body region has the first conductivity type.

11. The fully-isolated MOS device according to claim 10 further comprising: a fourth well formed in the isolation well on the first side of the gate structure to surround the second body region, wherein the fourth well has the first conductivity type.

12. The fully-isolated MOS device according to claim 1 further comprising: a second isolation structure formed between the gate structure and the drain region.

* * * * *